(12) United States Patent
Hayakawa

(10) Patent No.: US 11,509,344 B2
(45) Date of Patent: Nov. 22, 2022

(54) RADIO FREQUENCY MODULE AND COMMUNICATION DEVICE

(71) Applicant: Murata Manufacturing Co., Ltd., Nagaokakyo (JP)

(72) Inventor: Masashi Hayakawa, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 16 days.

(21) Appl. No.: 17/209,246

(22) Filed: Mar. 23, 2021

(65) Prior Publication Data
US 2021/0306024 A1 Sep. 30, 2021

(30) Foreign Application Priority Data
Mar. 31, 2020 (JP) .............................. JP2020-061858

(51) Int. Cl.
H04B 1/40 (2015.01)
H03F 3/19 (2006.01)
H03F 1/56 (2006.01)

(52) U.S. Cl.
CPC .................. H04B 1/40 (2013.01); H03F 1/56 (2013.01); H03F 3/19 (2013.01); *H03F 2200/255* (2013.01); *H03F 2200/294* (2013.01); *H03F 2200/451* (2013.01)

(58) Field of Classification Search
CPC .................. H03F 1/56; H03F 2200/111; H03F 2200/255; H03F 2200/294; H03F 2200/451; H03F 2203/7209; H03F 3/19; H03F 3/195; H03F 3/72; H04B 1/006; H04B 1/40
See application file for complete search history.

(56) References Cited

U.S. PATENT DOCUMENTS

2016/0127025 A1* 5/2016 Wloczysiak ......... H04B 7/0817
                                                         375/267
2019/0158042 A1* 5/2019 Abdelrazek Medra ...................
                                                         H03F 1/565

FOREIGN PATENT DOCUMENTS

| JP | 2018-137522 A | 8/2018 |
| KR | 10-2006-0062153 A | 6/2006 |
| KR | 10-2020-0018624 A | 2/2020 |
| WO | 2018/168500 A1 | 9/2018 |

OTHER PUBLICATIONS

Office Action dated Mar. 8, 2022 in Korean Patent Application No. 10-2021-0033096, 9 pages.

* cited by examiner

*Primary Examiner* — Nguyen T Vo
(74) *Attorney, Agent, or Firm* — Xsensus LLP

(57) ABSTRACT

A radio frequency module includes: a first low-noise amplifier including a first amplification element as an input stage and a second amplification element as an output stage; a second low-noise amplifier including a third amplification element as an input stage and the second amplification element as an output stage, the third amplification element being different from the first amplification element; a first matching circuit connected to an input terminal of the first low-noise amplifier; and a module substrate including a first principal surface and a second principal surface opposite to each other, wherein the first amplification element is disposed on one of the first principal surface and the second principal surface, and the first matching circuit is disposed on the other of the first principal surface and the second principal surface.

20 Claims, 7 Drawing Sheets

FIG. 3
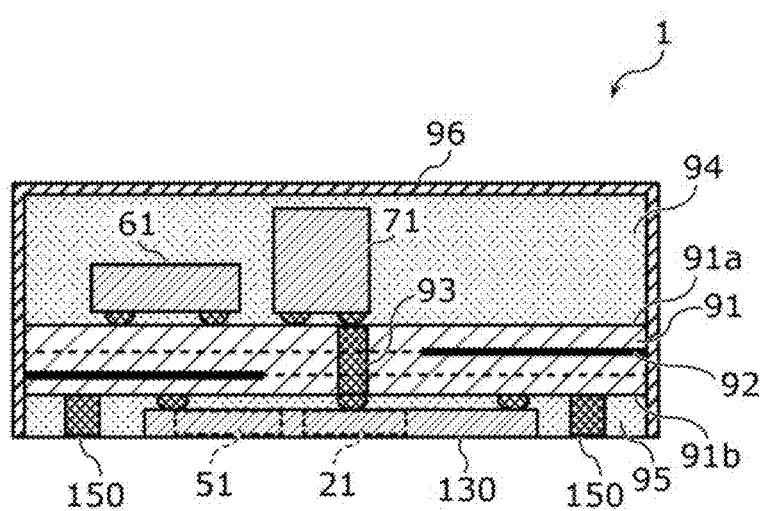
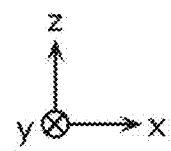

FIG. 6
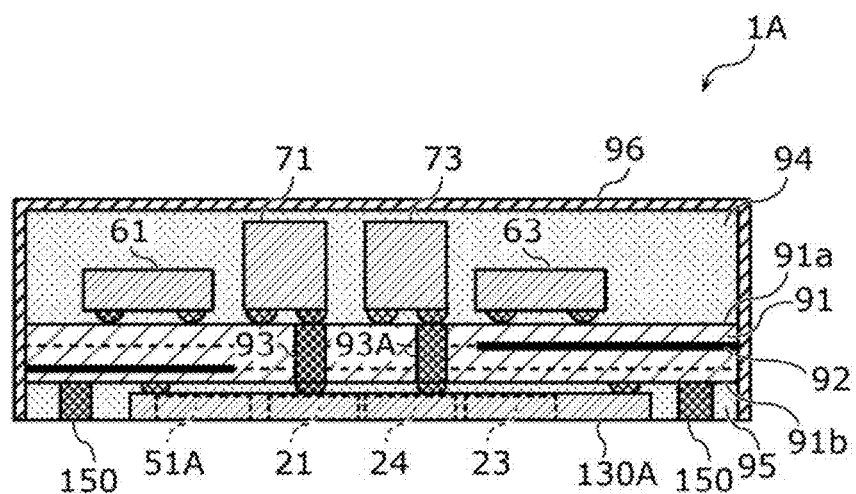
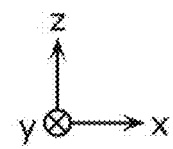

RADIO FREQUENCY MODULE AND COMMUNICATION DEVICE

CROSS REFERENCE TO RELATED APPLICATION

The present application is based on and claims priority of Japanese Patent Application No. 2020-061858 filed on Mar. 31, 2020. The entire disclosure of the above-identified application, including the specification, drawings and claims is incorporated herein by reference in its entirety.

TECHNICAL FIELD

The present disclosure relates to a radio frequency module and a communication device.

BACKGROUND

In a mobile communication device such as a mobile phone, the disposition and configuration of circuit components of a radio frequency front-end module are increasingly more complex with the progress particularly in multiband communications.

Japanese Unexamined Patent Application Publication No. 2018-137522 discloses a radio frequency module in which power amplifiers, low-noise amplifiers, switches, filters, and so forth are packaged.

SUMMARY

Technical Problems

However, as recognized by the present inventor, further downsizing is desired of the radio frequency module of the conventional technology.

In view of the above, the present disclosure provides a radio frequency module and a communication device that enable further downsizing of the radio frequency module.

Solutions

The radio frequency module according to an aspect of the present disclosure includes: a first low-noise amplifier including a first amplification element as an input stage and a second amplification element as an output stage; a second low-noise amplifier including a third amplification element as an input stage and the second amplification element as an output stage, the third amplification element being different from the first amplification element; a first matching circuit connected to an input terminal of the first low-noise amplifier; and a module substrate including a first principal surface and a second principal surface opposite to each other. In this radio frequency module, the first amplification element is disposed on one of the first principal surface and the second principal surface, and the first matching circuit is disposed on the other of the first principal surface and the second principal surface.

Advantageous Effects

The radio frequency module according to an aspect of the present disclosure allows for further downsizing.

BRIEF DESCRIPTION OF DRAWINGS

These and other advantages and features will become apparent from the following description thereof taken in conjunction with the accompanying Drawings, by way of non-limiting examples of embodiments disclosed herein.

FIG. 3 is a cross-sectional view of the radio frequency module according to Embodiment 1.

FIG. 6 is a cross-sectional view of the radio frequency module according to Embodiment 2.

DESCRIPTION OF EMBODIMENTS

Figure 1:
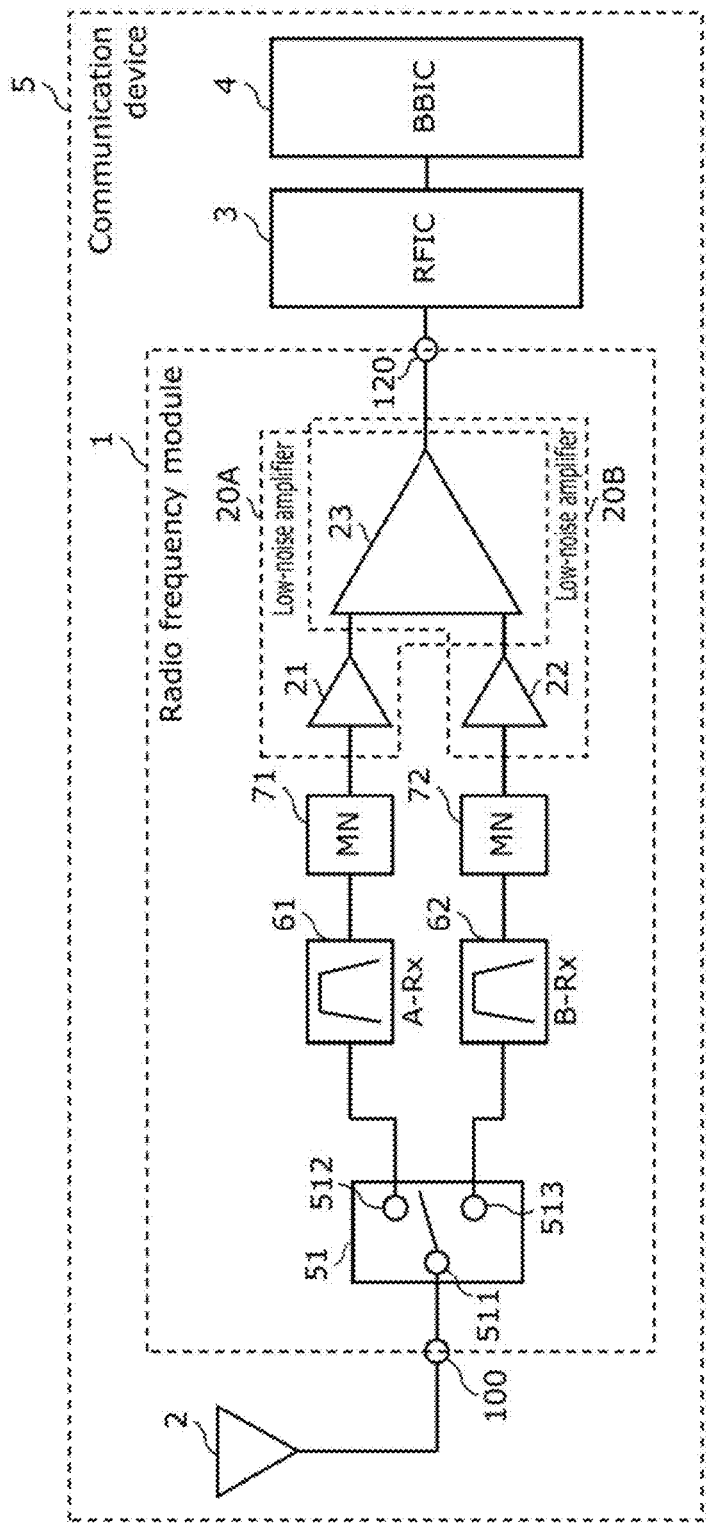
FIG. 1 is a diagram showing the circuit configurations of a radio frequency module and a communication device according to Embodiment 1.

The following describes in detail the embodiments according to the present disclosure with reference to the drawings. Note that the following embodiments show a comprehensive or specific example of the present disclosure. The numerical values, shapes, materials, structural elements, the arrangement and connection of the structural elements, etc. shown in the following embodiments are mere examples, and thus are not intended to limit the present disclosure.

Note that the drawings are schematic diagrams in which emphasis, omission, or ratio adjustment has been applied where necessary to illustrate the present disclosure. The drawings are thus not necessarily exact illustration of the present disclosure, and may illustrate shapes, positional relationships, and ratios differently from the actual ones. In the drawings, substantially the same structural elements are assigned the same reference marks, and their repetitive description may be omitted or simplified.

In the drawings, the x axis and the y axis are orthogonal to each other on a plane that is parallel to a principal surface of a module substrate. Also, the z axis is normal to a principal surface of the module substrate. The positive direction and the negative direction of the z axis indicate the upward direction and the downward direction, respectively.

In the circuit configuration according to the present disclosure, "directly connected" means that elements are directly connected via a connection terminal and/or a wiring conductor without being connected via another circuit element. Meanwhile, "connected" means not only the case where elements are directly connected via a connection terminal and/or a wiring conductor, but also the case where elements are electrically connected via another circuit element. Also, "connected between A and B" means that an element is connected to both A and B in between A and B.

Also, in the component disposition of the present disclosure, "in a plan view of a module substrate" means a view of an object that is orthographically projected onto the xy plane and seen from the positive direction of the z axis. Also, "A overlaps B in a plan view of the module substrate" means that at least part of the region of A that is orthographically projected onto the xy plane overlaps at least part of the region of B that is orthographically projected onto the xy plane.

Also, "a component is disposed on a substrate" means not only the case where the component is disposed on the substrate in contact with the substrate, but also the cases where the component is disposed above the substrate without contacting the substrate (e.g., the component is stacked on another component that is disposed on the substrate) and where a part or the entirety of the component is embedded in the substrate. Also, "a component is disposed on a principal surface of a substrate" means not only the case where the component is disposed on the principal surface in contact with the principal surface of the substrate, but also the cases where the component is disposed above the principal surface without contacting the principal surface and where part of the component is embedded in the substrate from the side of the principal surface.

Also, terms that represent the relation between elements (e.g., "parallel" and "vertical") indicate not only the exact meanings of the terms, but also substantially equivalent scopes of the terms. For example, such terms include the meaning of a few percent of error.

Embodiment 1

[1.1 Circuit Configurations of Radio Frequency Module 1 and Communication Device 5]

With reference to FIG. 1, the following describes the circuit configurations of radio frequency module 1 and communication device 5 according to the present embodiment. FIG. 1 is a diagram showing the circuit configurations of radio frequency module 1 and communication device 5 according to Embodiment 1.

[1.1.1 Circuit Configuration of Communication Device 5]

First, the circuit configuration of communication device 5 will be described. As shown in FIG. 1, communication device 5 according to the present embodiment includes radio frequency module 1, antenna 2, RFIC 3, and BBIC 4. The following sequentially describes the structural elements of communication device 5.

Radio frequency module 1 transfers a radio frequency signal between antenna 2 and RFIC 3. The circuit configuration of radio frequency module 1 will be described later.

Antenna 2 is connected to antenna connection terminal 100 of radio frequency module 1. Antenna 2 receives a radio frequency signal from outside and outputs the received radio frequency signal to radio frequency module 1.

RFIC 3 is an exemplary signal processing circuit that processes a radio frequency signal. More specifically, RFIC 3 performs signal processing, such as down-conversion, on a radio frequency reception signal inputted via a reception path of radio frequency module 1, and outputs the resulting reception signal to BBIC 4. RFIC 3 includes a controller that controls a switch, low-noise amplifiers, and so forth included in radio frequency module 1. Note that one or more, or all of the functions of RFIC 3 as a controller may be implemented outside of RFIC 3, and thus may be implemented in, for example, BBIC 4 or radio frequency module 1.

BBIC 4 is a baseband signal processing circuit that performs signal processing by use of an intermediate frequency band, the frequency of which is lower than that of a radio frequency signal transferred by radio frequency module 1. Used as the signal processed by BBIC 4 is, for example, an image signal for image display, or a sound signal for telephone conversation through a speaker.

Note that antenna 2 and BBIC 4 are not essential structural elements of communication device 5 according to the present embodiment.

[1.1.2 Circuit Configuration of Radio Frequency Module 1]

The following describes the circuit configuration of radio frequency module 1. As shown in FIG. 1, radio frequency module 1 includes low-noise amplifiers 20A and 20B, switch 51, filters 61 and 62, matching circuits (MNs) 71 and 72, antenna connection terminal 100, and radio frequency output terminal 120.

Antenna connection terminal 100, which is an exemplary external-connection terminal, is connected to antenna 2.

Radio frequency output terminal 120, which is an exemplary external-connection terminal, is a terminal for providing a radio frequency reception signal to outside of radio frequency module 1.

Low-noise amplifier 20A, which is an example of the first low-noise amplifier, is a multistage amplifier that includes amplification element 21 as the input stage and amplification element 23 as the output stage. Low-noise amplifier 20A is capable of amplifying a radio frequency signal in communication band A. Low-noise amplifier 20A outputs the amplified radio frequency signal to radio frequency output terminal 120.

Low-noise amplifier 20B, which is an example of the second low-noise amplifier, is a multistage amplifier that includes amplification element 22 as the input stage and amplification element 23 as the output stage. Low-noise amplifier 20B is capable of amplifying a radio frequency signal in communication band B. Low-noise amplifier 20B outputs the amplified radio frequency signal to radio frequency output terminal 120.

Communication bands A and B are exemplary first communication band and second communication band, respectively. Communication bands A and B are frequency bands that are predefined for communication system(s) that are configured using a radio access technology (RAT) by, for example, a standard body, etc. such as the 3rd Generation Partnership Project (3G PP) and Institute of Electrical and Electronics Engineers (IEEE).

Used as communication bands A and B are different communication bands for the same communication system or different communication systems. Non-limiting examples of communication bands A and B to be used include a 5th Generation New Radio (5G NR) band, a Long Term Evolution (LTE) band, and a Wireless Local Area Network (WLAN) band.

Amplification element 21, which is an example of the first amplification element, is cascaded to amplification element 23, but not cascaded to amplification element 22. Amplification element 21 is capable of amplifying a radio frequency signal in communication band A. Stated differently, the operation of amplification element 21 is not to be stopped to receive a radio frequency signal in communication band A. Meanwhile, the operation of amplification element 21 is to be stopped to receive a radio frequency signal in communication band B.

Amplification element 22, which is an example of the third amplification element, is cascaded to amplification element 23, but not cascaded to amplification element 21. Amplification element 22 is capable of amplifying a radio frequency signal in communication band B. Stated differently, the operation of amplification element 22 is not to be stopped to receive a radio frequency signal in communication band B. Meanwhile, the operation of amplification element 22 is to be stopped to receive a radio frequency signal in communication band A.

Amplification element 23, which is an example of the second amplification element, is cascaded to amplification elements 21 and 22. Amplification element 23 is capable of amplifying radio frequency signals in communication bands A and B. Stated differently, the operation of amplification element 23 is not to be stopped to receive a radio frequency signal, regardless of whether it is a signal in communication band A or B. Amplification element 23 is shared as the output stage between low-noise amplifiers 20A and 20B.

Note that "the operation of an amplification element is to be stopped" means that the amplification element is set to the state of performing no signal amplification (i.e., OFF state). In the OFF state, for example, the supply of at least one of a bias signal or a power-supply voltage to the amplification element is stopped. Meanwhile, "the operation of an amplification element is not to be stopped" means that the amplification element is set to the state of performing signal amplification (i.e., ON state). In the ON state, for example, both a bias signal and a power-supply voltage are supplied to the amplification element.

Filter 61 is connected between antenna connection terminal 100 and low-noise amplifier 20A. Filter 61 passes a signal in the reception band of communication band A among radio frequency reception signals inputted from antenna connection terminal 100.

Filter 62 is connected between antenna connection terminal 100 and low-noise amplifier 20B. Filter 62 passes a signal in the reception band of communication band B among radio frequency reception signals inputted from antenna connection terminal 100.

Matching circuit 71, which is an example of the first matching circuit, is connected to the input terminal of low-noise amplifier 20A. Matching circuit 71 according to the present embodiment is located between filter 61 and low-noise amplifier 20A and directly connected to filter 61 and low-noise amplifier 20A. Stated differently, no switch is interposed between filter 61 and low-noise amplifier 20A. Matching circuit 71 matches the impedance between filter 61 and low-noise amplifier 20A.

Matching circuit 72, which is an example of the second matching circuit, is connected to the input terminal of low-noise amplifier 20B. Matching circuit 72 according to the present embodiment is located between filter 62 and low-noise amplifier 20B and directly connected to filter 62 and low-noise amplifier 20B. Stated differently, no switch is interposed between filter 62 and low-noise amplifier 20B. Matching circuit 72 matches the impedance between filter 62 and low-noise amplifier 20B.

Switch 51 is connected between antenna connection terminal 100 and each of filters 61 and 62. More specifically, switch 51 includes terminals 511 through 513. Terminal 511 of switch 51 is connected to antenna connection terminal 100. Terminals 512 and 513 of switch 51 are connected to filters 61 and 62, respectively. Having such connection structure, switch 51 connects one of terminals 512 and 513 to terminal 511 on the basis of, for example, a control signal from RFIC 3. Stated differently, switch 51 switches between connecting antenna 2 and filter 61, and connecting antenna 2 and filter 62. Switch 51 is implemented, for example, as a single pole double throw (SPDT) switch circuit, and is referred to as an antenna switch.

Note that radio frequency module 1 may not include one or more of the circuit elements shown in FIG. 1. Radio frequency module 1 is simply required to include, for example, at least low-noise amplifiers 20A and 20B, and matching circuit 71, without including the other circuit elements.

[1.2 Component Disposition of Radio Frequency Module 1]

Figure 2:
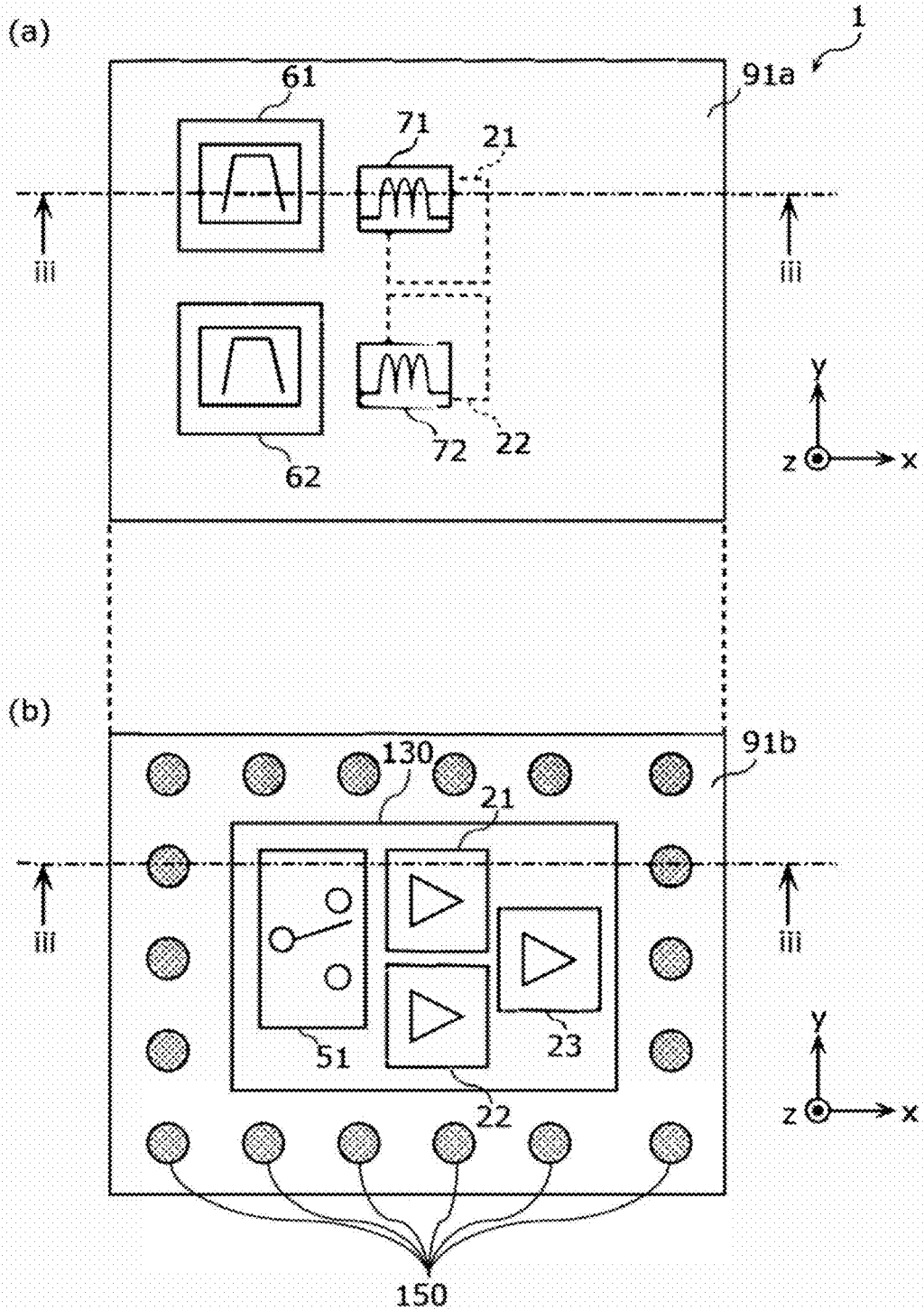
FIG. 2 is a plan view of the radio frequency module according to Embodiment 1.

With reference to FIG. 2 and FIG. 3, the following specifically describes the component disposition of radio frequency module 1 with the above configuration.

FIG. 2 is a plan view of radio frequency module 1 according to Embodiment 1. In FIG. 2, (a) is a view of principal surface 91a of module substrate 91 seen from the positive direction of the z axis, and (b) is a perspective view of principal surface 91b of module substrate 91 seen from the positive direction of the z axis. In (a) in FIG. 2, the dashed lines indicate objects located at the side of principal surface 91b of module substrate 91. FIG. 3 is a cross-sectional view of radio frequency module 1 according to Embodiment 1. FIG. 3 shows a cross-section of radio frequency module 1 cut along iii-iii line shown in FIG. 2.

As shown in FIG. 2 and FIG. 3, radio frequency module 1 further includes module substrate 91, resin members 94 and 95, shield electrode layer 96, and a plurality of post electrodes 150, in addition to the circuit components that include the circuit elements shown in FIG. 1. Note that FIG. 2 omits the illustration of resin members 94 and 95, and shield electrode layer 96.

Module substrate 91 includes principal surfaces 91a and 91b opposite to each other. Non-limiting examples of module substrate 91 to be used include: a low temperature co-fired ceramics (LTCC) substrate including stacked dielectric layers; a high temperature co-fired ceramics (HTCC) substrate including stacked dielectric layers; a component-embedded substrate; a substrate having a redistribution layer (RDL); and a printed circuit board. Ground electrode trace 92 is located inside of module substrate 91.

Principal surface 91a, which is an example of the first principal surface, is also referred to as an upper surface or a surface. Disposed on principal surface 91a are filters 61 and 62, matching circuits 71 and 72, and resin member 94.

Non-limiting examples of each of filters 61 and 62 include a surface acoustic wave (SAW) filter, an acoustic wave filter utilizing bulk acoustic wave (BAW), an LC resonant filter, a dielectric filter, or any combination of these filters.

Each of matching circuits 71 and 72 includes, for example, an inductor and/or a capacitor. Matching circuits 71 and 72 are implemented as surface mount devices (SMDs). Note that matching circuits 71 and 72 may be located inside of module substrate 91, and may be implemented as integrated passive devices (IPDs).

Resin member 94 is disposed on principal surface 91a of module substrate 91 and covers the circuit components on principal surface 91a. Resin member 94 is capable of ensuring the reliability of the components on principal surface 91a, such as their mechanical strength and humidity resistance.

Principal surface 91b, which is an example of the second principal surface, is also referred to as a lower surface or a back surface. Disposed on principal surface 91b are semiconductor component 130, resin member 95, and a plurality of post electrodes 150.

Semiconductor component 130 includes amplification elements 21 through 23, and switch 51. As such, amplification element 21 and matching circuit 71 are disposed on the opposing surfaces of module substrate 91, and amplification element 22 and matching circuit 72 are disposed on the opposing surfaces of module substrate 91.

Semiconductor component 130, which is also referred to as a semiconductor integrated circuit, is an electronic component that includes an electronic circuit on a surface or inside of a semiconductor chip (also referred to as die). Semiconductor component 130 may have, for example, a complementary metal oxide semiconductor (CMOS) structure. More specifically, semiconductor component 130 may be fabricated by a silicon on insulator (SOI) process. This enables a low-cost manufacture of semiconductor component 130. Note that semiconductor component 130 may include at least one of GaAs, SiGe, or GaN. This enables to provide high quality semiconductor component 130.

As shown in (a) in FIG. 2, in a plan view of module substrate 91, a footprint of amplification element 21 overlaps a footprint of matching circuit 71, and a footprint of amplification element 22 overlaps a footprint of matching circuit 72. Also, as shown in FIG. 3, amplification element 21 is connected to matching circuit 71 by way of via-conductor 93 located inside of module substrate 91. Similarly, amplification element 22 is connected to matching circuit 72 by way of a via-conductor (not illustrated) located inside of module substrate 91.

Via-conductor 93 is a conductor filled in a through via that penetrates through module substrate 91 along the z axis. Note that via-conductor 93 is not limited to a conductor filled in a through via. Via-conductor 93 may thus include, for example, a conductor filled in a blind via located at the side of principal surface 91a, a conductor filled in a blind via located at the side of principal surface 91b, and a planar electrode trace that connects, inside of module substrate 91, these conductors filled in the two blind vias.

Note that switch 51 according to the present embodiment is included in semiconductor component 130, but the present disclosure is not limited to this configuration. Switch 51 may be individually disposed on principal surface 91a or 91b, without being included in semiconductor component 130.

Resin member 95 is disposed on principal surface 91b of module substrate 91 and covers the circuit components on principal surface 91b. Resin member 95 is capable of ensuring the reliability of the components on principal surface 91b, such as their mechanical strength and humidity resistance.

A plurality of post electrodes 150 are implemented as a plurality of external-connection terminals that include antenna connection terminal 100 and radio frequency output terminal 120. Each of post electrodes 150 is disposed on principal surface 91b of module substrate 91 and extends vertically from principal surface 91b. Each of post electrodes 150 protrudes through resin member 95, with one end of post electrode 150 exposed from resin member 95. One end of each post electrode 150 being exposed from resin member 95 is connected to an input-output terminal and/or a ground electrode, and so forth on the mother board that is disposed at the negative side of the z axis of radio frequency module 1.

Shield electrode layer 96 is a metal thin film formed, for example, by spattering. Shield electrode layer 96 covers upper and side surfaces of resin member 94, and side surfaces of module substrate 91 and resin member 95. Shield electrode layer 96 is set at the ground potential and inhibits exogenous noise from entering the circuit components included in radio frequency module 1.

[1.3 Effects, Etc.]

As described above, radio frequency module 1 according to the present embodiment includes: low-noise amplifier 20A including amplification element 21 as an input stage and amplification element 23 as an output stage; low-noise amplifier 20B including amplification element 22 as an input stage and amplification element 23 as an output stage, amplification element 22 being different from amplification element 21; matching circuit 71 connected to an input terminal of low-noise amplifier 20A; and module substrate 91 including principal surfaces 91a and 91b opposite to each other. In radio frequency module 1, amplification element 21 is disposed on one of principal surfaces 91a and 91b, and matching circuit 71 is disposed on the other of principal surfaces 91a and 91b.

In this configuration, amplification element 21 and matching circuit 71 are disposed on the opposing surfaces of module substrate 91. Stated differently, this configuration enables to dispose circuit components on the both surfaces of module substrate 91. This reduces the footprint of module substrate 91, thus achieving the downsizing of radio frequency module 1, compared to the case where circuit components are disposed on a single surface of module substrate 91.

In radio frequency module 1 according to the present embodiment, for example, in a plan view of module substrate 91, the footprint of amplification element 21 may overlap the footprint of matching circuit 71.

In this configuration, amplification element 21 is disposed in the proximity to matching circuit 71 across module substrate 91 from matching circuit 71. This configuration thus achieves a reduced wiring length between amplification element 21 and matching circuit 71. This configuration consequently reduces mismatching losses caused by wiring losses and wiring variations, thereby improving the electrical characteristics of radio frequency module 1.

In radio frequency module 1 according to the present embodiment, for example, amplification element 21 may be connected to matching circuit 71 by way of via-conductor 93 located inside of module substrate 91.

In this configuration, amplification element 21 is connected to matching circuit 71 by way of via-conductor 93. This configuration thus achieves a further reduced wiring length between amplification element 21 and matching circuit 71. Consequently, this configuration further reduces mismatching losses caused by wiring losses and wiring variations, thereby further improving the electrical characteristics of radio frequency module 1.

Radio frequency module 1 according to the present embodiment may further include, for example, matching circuit 72 connected to an input terminal of low-noise amplifier 20B. In radio frequency module 1, amplification element 22 may be disposed on one of principal surfaces 91a and 91b, and matching circuit 72 may be disposed on the other of principal surfaces 91a and 91b.

In this configuration, amplification element 22 and matching circuit 72 are also disposed on the opposing surfaces of module substrate 91, in addition to amplification element 21 and matching circuit 71. Stated differently, this configuration enables to dispose circuit components on two principal surfaces 91a and 91b of module substrate 91 in a balanced manner. This reduces the footprint of module substrate 91, thus achieving the downsizing of radio frequency module 1, compared to the case where circuit components are disposed on a single surface of module substrate 91.

In radio frequency module 1 according to the present embodiment, for example, in a plan view of module substrate 91, the footprint of amplification element 22 may overlap the footprint of matching circuit 72.

In this configuration, amplification element 22 is disposed in the proximity to matching circuit 72 across module substrate 91 from matching circuit 72. This configuration thus achieves a reduced wiring length between amplification element 22 and matching circuit 72. This configuration consequently reduces mismatching losses caused by wiring losses and wiring variations, thereby improving the electrical characteristics of radio frequency module 1.

In radio frequency module 1 according to the present embodiment, for example, matching circuit 72 may be connected to amplification element 22 by way of a via-conductor located inside of module substrate 91.

In this configuration, amplification element 22 is connected to matching circuit 72 by way of the via-conductor. This configuration thus achieves a further reduced wiring length between amplification element 22 and matching circuit 72. Consequently, this configuration further reduces mismatching losses caused by wiring losses and wiring variations, thereby further improving the electrical characteristics of radio frequency module 1.

Radio frequency module 1 according to the present embodiment may further include, for example, filter 61 connected to the input terminal of low-noise amplifier 20A via matching circuit 71; and filter 62 connected to the input terminal of low-noise amplifier 20B via matching circuit 72. In radio frequency module 1, matching circuit 71 may be directly connected to filter 61 and low-noise amplifier 20A, and matching circuit 72 may be directly connected to filter 62 and low-noise amplifier 20B.

In this configuration, matching circuit 71 is directly connected between filter 61 and low-noise amplifier 20A, and matching circuit 72 is directly connected between filter 62 and low-noise amplifier 20B. This configuration eliminates the necessity of radio frequency module having to include a switch for switching between low-noise amplifiers 20A and 20B, thus preventing the degradation, caused by a switch, in the electrical characteristics of radio frequency module 1.

In radio frequency module 1 according to the present embodiment, for example, an operation of amplification element 22 may be stopped to receive a radio frequency signal in communication band A, and an operation of amplification element 21 may be stopped to receive a radio frequency signal in communication band B that is different from communication band A.

In this configuration, the operation of amplification element 22 is stopped to receive a radio frequency signal in communication band A. This configuration thus prevents amplification elements 22 and 23 from amplifying noise, thus improving the receiving sensitivity of the radio frequency signal in communication band A. For the reception of a radio frequency signal in communication band B, this configuration prevents amplification elements 21 and 23 from amplifying noise, thus improving the receiving sensitivity of the radio frequency signal in communication band B.

Also, radio frequency module 1 according to the present embodiment may further include, for example, a plurality of post electrodes 150 as a plurality of external-connection terminals. In radio frequency module 1, matching circuits 71 and 72, and filters 61 and 62 may be disposed on principal surface 91a, and low-noise amplifiers 20A and 20B, and a plurality post electrodes 150 may be disposed on principal surface 91b.

In this configuration, components, the height of which is relatively easy to reduce, are disposed on the lower surface of module substrate 91, and components, the height of which is relatively hard to reduce, are disposed on the upper surface of module substrate 91. This configuration thus achieves the height reduction of the entire radio frequency module 1.

In radio frequency module 1 according to the present embodiment, for example, low-noise amplifiers 20A and 20B may be included in the same semiconductor component 130.

In this configuration, low-noise amplifiers 20A and 20B are integrated in a single semiconductor component 130. This configuration thus contributes to the downsizing of radio frequency module 1.

Also, communication device 5 according to the present embodiment includes: RFIC 3 that processes a radio frequency signal; and radio frequency module 1 that transfers the radio frequency signal between RFIC 3 and antenna 2.

Communication device 5 with the above configuration achieves the same effects as those achieved by radio frequency module 1.

Embodiment 2

The following describes Embodiment 2. The present embodiment is different from Embodiment 1 mainly in that the radio frequency module according to the present embodiment includes a reception circuit that receives radio frequency signals in communication bands C and D, in addition to the reception circuit that receives radio frequency signals in communication bands A and B. With reference to the drawings, the following focuses on the difference from Embodiment 1 to describe the present embodiment.

[2.1 Circuit Configuration of Radio Frequency Module 1A]

Figure 4:
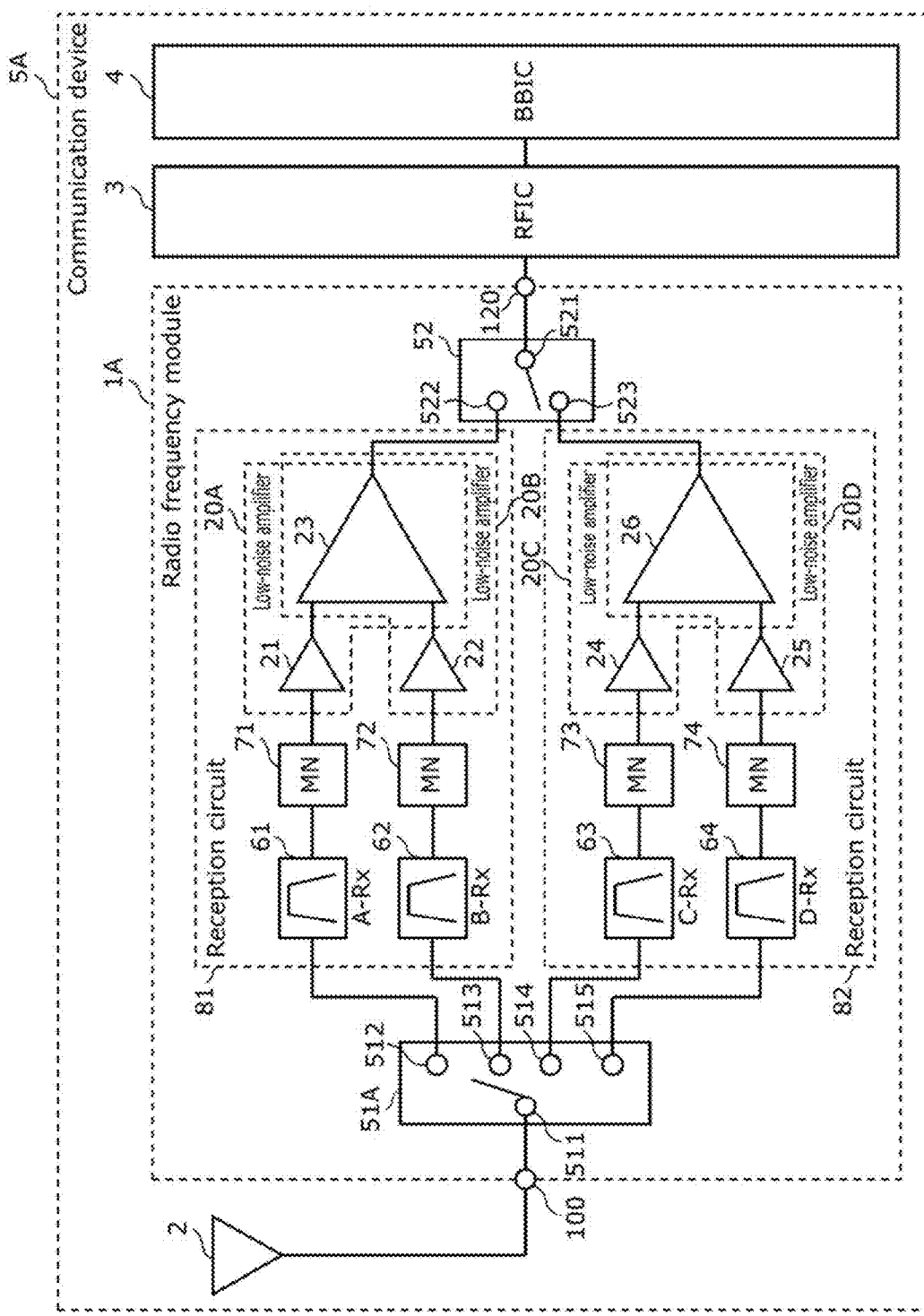
FIG. 4 is a diagram showing the circuit configurations of a radio frequency module and a communication device according to Embodiment 2.

FIG. 4 is a diagram showing the circuit configurations of radio frequency module 1A and communication device 5A according to Embodiment 2. The circuit configuration of communication device 5A according to the present embodiment will not be described here, because it is the same as the circuit configuration of communication device 5 according to Embodiment 1, excluding that communication device 5A includes radio frequency module 1A instead of radio frequency module 1.

Radio frequency module 1A includes reception circuits 81 and 82, switches 51A and 52, antenna connection terminal 100, and radio frequency output terminal 120.

Reception circuit 81, which is an exemplary first reception circuit, includes low-noise amplifiers 20A and 20B, filters 61 and 62, and matching circuits 71 and 72. Note that low-noise amplifiers 20A and 20B, filters 61 and 62, and matching circuits 71 and 72 included in reception circuit 81 are the same as those of Embodiment 1, and thus will not be described here.

Reception circuit 82, which is an exemplary second reception circuit, includes low-noise amplifiers 20C and 20D, filters 63 and 64, and matching circuits 73 and 74.

Low-noise amplifier 20C is a multistage amplifier that includes amplification element 24 as the input stage and amplification element 26 as the output stage. Low-noise amplifier 20C is capable of amplifying a radio frequency signal in communication band C. Low-noise amplifier 20C outputs the amplified radio frequency signal to radio frequency output terminal 120 via switch 52.

Low-noise amplifier 20D is a multistage amplifier that includes amplification element 25 as the input stage and amplification element 26 as the output stage. Low-noise amplifier 20D is capable of amplifying a radio frequency signal in communication band D. Low-noise amplifier 20D outputs the amplified radio frequency signal to radio frequency output terminal 120 via switch 52.

As with communication bands A and B, used as communication bands C and D are different communication bands for the same communication system or different communication systems.

Amplification element 24 is cascaded to amplification element 26, but not cascaded to amplification element 25. Amplification element 24 is capable of amplifying a radio frequency signal in communication band C. Stated differently, the operation of amplification element 24 is not to be stopped to receive a radio frequency signal in communication band C. Meanwhile, the operation of amplification element 24 is to be stopped to receive a radio frequency signal in communication band D.

Amplification element 25 is cascaded to amplification element 26, but not cascaded to amplification element 24. Amplification element 25 is capable of amplifying a radio frequency signal in communication band D. Stated differently, the operation of amplification element 25 is not to be stopped to receive a radio frequency signal in communication band D. Meanwhile, the operation of amplification element 25 is to be stopped to receive a radio frequency signal in communication band C.

Amplification element 26 is cascaded to amplification elements 24 and 25. Amplification element 26 is capable of amplifying radio frequency signals in communication bands C and D. Stated differently, the operation of amplification element 26 is not to be stopped to receive a radio frequency signal regardless of whether it is a signal in communication band C or D. Amplification element 26 is shared as the output stage between low-noise amplifiers 20C and 20D.

Filter 63 is connected between antenna connection terminal 100 and low-noise amplifier 20C. Filter 63 passes a signal in the reception band of communication band C among radio frequency reception signals inputted from antenna connection terminal 100.

Filter 64 is connected between antenna connection terminal 100 and low-noise amplifier 20D. Filter 64 passes a signal in the reception band of communication band D among radio frequency reception signals inputted from antenna connection terminal 100.

Matching circuit 73 is connected to the input terminal of low-noise amplifier 20C. Matching circuit 73 according to the present embodiment is located between filter 63 and low-noise amplifier 20C and directly connected to filter 63 and low-noise amplifier 20C. Stated differently, no switch is interposed between filter 63 and low-noise amplifier 20C. Matching circuit 73 matches the impedance between filter 63 and low-noise amplifier 20C.

Matching circuit 74 is connected to the input terminal of low-noise amplifier 20D. Matching circuit 74 according to the present embodiment is located between filter 64 and low-noise amplifier 20D and directly connected to filter 64 and low-noise amplifier 20D. Stated differently, no switch is interposed between filter 64 and low-noise amplifier 20D. Matching circuit 74 matches the impedance between filter 64 and low-noise amplifier 20D.

Switch 51A is connected between antenna connection terminal 100 and each of filters 61 through 64. More specifically, switch 51A includes terminals 511 through 515. Terminal 511 of switch 51A is connected to antenna connection terminal 100. Terminals 512, 513, 514, and 515 of switch 51A are connected to filters 61, 62, 63, and 64, respectively. Having such connection structure, switch 51A connects one of terminals 512 through 515 to terminal 511 on the basis of, for example, a control signal from RFIC 3. Stated differently, switch 51A switches between connecting antenna 2 and filter 61, connecting antenna 2 and filter 62, connecting antenna 2 and filter 63, and connecting antenna 2 and filter 64. Switch 51A is implemented, for example, as a single pole quadruple throw (SP4T) switch circuit, and is referred to as an antenna switch.

Switch 52 switches between connecting reception circuit 81 and radio frequency output terminal 120, and connecting reception circuit 82 and radio frequency output terminal 120. More specifically, switch 52 includes terminals 521 through 523. Terminal 521 of switch 52 is connected to radio frequency output terminal 120. Terminals 522 and 523 of switch 52 are connected to the output terminal of reception circuit 81 and the output terminal of reception circuit 82, respectively. Having such connection structure, switch 52 connects one of terminals 522 and 523 to terminal 521. Stated differently, switch 52 switches between connecting reception circuit 81 and radio frequency output terminal 120, and connecting reception circuit 82 and radio frequency output terminal 120. Switch 52 is implemented, for example, as an SPDT switch circuit, and is referred to as a bind switch or a reception output switch.

Note that the configuration of reception circuit 82 shown in FIG. 4 is a mere example, and thus the present disclosure is not limited to such configuration. Reception circuit 82 may be, for example, a circuit for receiving a radio frequency signal in a single communication band, or may be a circuit for transferring a radio frequency signal amplified in another radio frequency module.

[2.2 Component Disposition of Radio Frequency Module 1A]

Figure 5:
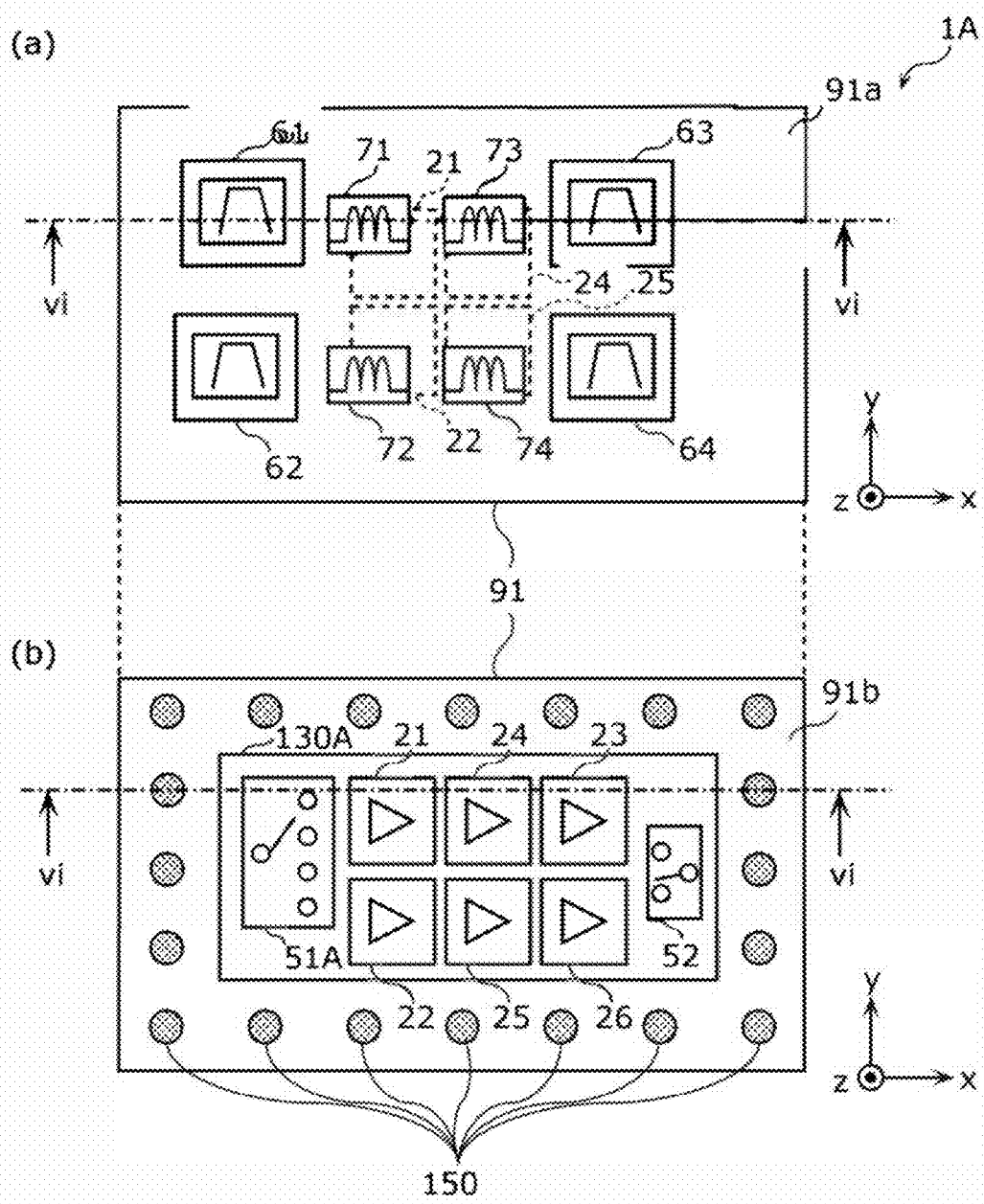
FIG. 5 is a plan view of the radio frequency module according to Embodiment 2.

With reference to FIG. 5 and FIG. 6, the following specifically describes the component disposition of radio frequency module 1A with the above configuration.

FIG. 5 is a plan view of radio frequency module 1A according to Embodiment 2. In FIG. 5, (a) is a view of principal surface 91a of module substrate 91 seen from the positive direction of the z axis, and (b) is a perspective view of principal surface 91b of module substrate 91 seen from the positive direction of the z axis. In (a) in FIG. 5, the dashed lines indicate objects located at the side of principal surface 91b of module substrate 91. FIG. 6 is a cross-sectional view of radio frequency module 1A according to Embodiment 2. FIG. 6 shows a cross-section of radio frequency module 1A cut along vi-vi line shown in FIG. 5.

As shown in FIG. 5 and FIG. 6, radio frequency module 1A further includes module substrate 91, resin members 94 and 95, shield electrode layer 96, and a plurality of post electrodes 150, in addition to the circuit components that include the circuit elements shown in FIG. 4. Note that FIG. 5 omits the illustration of resin members 94 and 95, and shield electrode layer 96.

Disposed on principal surface 91a of module substrate 91 are filters 61 through 64, matching circuits 71 through 74, and resin member 94.

As with filters 61 and 62, non-limiting examples of each of filters 63 and 64 include a SAW filter, an acoustic wave filter utilizing BAW, an LC resonant filter, a dielectric filter, or any combination of these filters.

As with matching circuits 71 and 72, each of matching circuits 73 and 74 includes, for example, an inductor and/or a capacitor. Matching circuits 73 and 74 are implemented as SMDs. Note that matching circuits 73 and 74 may be located inside of module substrate 91, and may be implemented as IPDs.

Disposed on principal surface 91b of module substrate 91 are semiconductor component 130A, resin member 95, and a plurality of post electrodes 150.

Semiconductor component 130A includes amplification elements 21 through 26, and switches 51A and 52. As such, amplification element 21 and matching circuit 71 are disposed on the opposing surfaces of module substrate 91, and amplification element 22 and matching circuit 72 are disposed on the opposing surfaces of module substrate 91. Further, amplification element 24 and matching circuit 73 are disposed on the opposing surfaces of module substrate 91, and amplification element 25 and matching circuit 74 are disposed on the opposing surfaces of module substrate 91.

As with semiconductor component 130 according to Embodiment 1, semiconductor component 130A may have, for example, a CMOS structure. More specifically, semiconductor component 130A may be fabricated by a SOI process. Semiconductor component 130A may include at least one of GaAs, SiGe, or GaN.

As shown in (a) in FIG. 5, in a plan view of module substrate 91, the footprint of amplification element 21 overlaps the footprint of matching circuit 71, and the footprint of amplification element 22 overlaps the footprint of matching circuit 72. Also, a footprint of amplification element 24 overlaps a footprint of matching circuit 73, and a footprint of amplification element 25 overlaps a footprint of matching circuit 74. Also, as shown in FIG. 6, amplification element 21 is connected to matching circuit 71 by way of via-conductor 93 located inside of module substrate 91, and amplification element 24 is connected to matching circuit 73 by way of via-conductor 93A located inside of module substrate 91. Similarly, amplification element 22 is connected to matching circuit 72 by way of a via-conductor (not illustrated) located inside of module substrate 91, and amplification element 25 is connected to matching circuit 74 by way of a via-conductor (not illustrated) located inside of module substrate 91.

Note that switches 51A and 52 according to the present embodiment are included in semiconductor component 130A, but the present disclosure is not limited to this configuration. One of, or both of switches 51A and 52 may be individually disposed on principal surface 91a or 91b, without being included in semiconductor component 130A.

[2.3 Effects, Etc.]

In radio frequency module 1A according to the present embodiment, low-noise amplifiers 20A and 20B, and matching circuit 71 may be included in reception circuit 81. Radio frequency module 1A may further include: reception circuit 82; and switch 52 that switches between connecting reception circuit 81 and radio frequency output terminal 120, and connecting reception circuit 82 and radio frequency output terminal 120.

In this configuration, one of reception circuits 81 and 82 is connected to radio frequency output terminal 120, thereby enabling a plurality of radio frequency signals to be selectively outputted from a single radio frequency output terminal 120. This configuration reduces the number of radio frequency output terminals.

In radio frequency module 1A according to the present embodiment, for example, low-noise amplifiers 20A and 20B, and switch 52 may be included in the same semiconductor component 130A.

This configuration, in which low-noise amplifiers 20A and 20B, and switch 52 are integrated in a single semiconductor component 130A, contributes to the downsizing of radio frequency module 1A.

Another Embodiment

The radio frequency module and the communication device according to the present disclosure have been described above on the basis of the embodiments, but the radio frequency module and the communication device according to the present disclosure are not limited to such embodiments. The present disclosure also includes: another embodiment achieved by freely combining structural elements in the foregoing embodiments; variations achieved by making various modifications to the foregoing embodiments that can be conceived by those skilled in the art without departing from the essence of the present disclosure; and various devices that include the radio frequency module and the communication device described above.

For example, in the circuit configurations of the radio frequency module and the communication device according to the foregoing embodiments, another circuit element, wiring, and so forth may be interposed in a path that connects each circuit element and a signal path disclosed in the drawings. For example, an impedance matching circuit may be interposed between switch 51 or 51A and each of filters 61 through 64. The impedance matching circuit may be implemented, for example, as an inductor and/or a capacitor.

Figure 7:
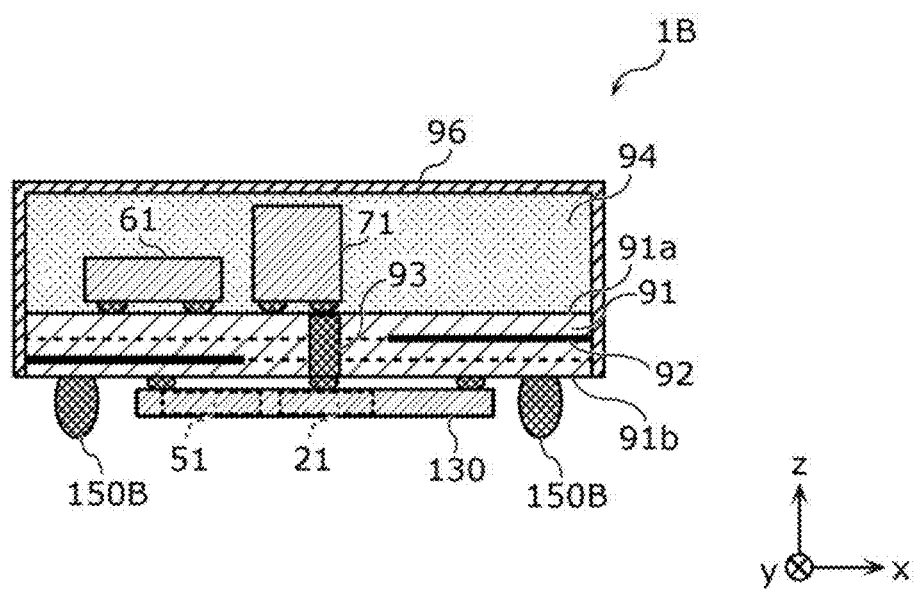
FIG. 7 is a cross-sectional view of a radio frequency module according to another embodiment.

Also, in the foregoing embodiments, a plurality of external-connection terminals are implemented as a plurality of post electrodes 150, but the present disclosure is not limited to this. Instead of being implemented as a plurality of post electrodes, a plurality of external-connection terminals may be implemented, for example, as a plurality of bump electrodes. FIG. 7 is a cross-sectional view of radio frequency module 1B according to another embodiment. As shown in FIG. 7, radio frequency module 1B may include a plurality of bump electrodes 150B implemented as a plurality of external-connection terminals. In this case, resin member 95 may not be disposed on principal surface 91b.

Note that in the foregoing embodiments, each of amplification elements 23 and 26 serving as the output stages is connected to two amplification elements serving as the input stages, but the number of input stages is not limited to two. For example, three or more amplification elements may be connected to amplification element 23 and/or amplification element 26. Stated differently, amplification element 23 and/or amplification element 26 may be shared as the output stage in three or more communication bands.

Also, in the foregoing embodiments, low-noise amplifiers 20A through 20D are two-stage amplifiers, but the present disclosure is not limited to this. For example, one or more, or all of low-noise amplifiers 20A through 20D may be amplifiers including three or more stages. In the case where low-noise amplifier 20A is an amplifier including three or more stages, for example, one or more amplification elements are simply required to be cascaded in between amplification elements 21 and 23.

Also, the component disposition in each of the foregoing embodiments is a mere example, and thus the present disclosure is not limited to such component disposition. In the foregoing embodiments, for example, the amplification elements may be disposed on principal surface 91a and the matching circuits may be disposed on principal surface 91b. Also, amplification elements 21 and 22 may not be disposed on the opposing surfaces of module substrate 91.

In the foregoing embodiments, both amplification elements 21 and 22 are disposed on the principal surface that is opposite to the principal surface on which matching circuits 71 and 72 are disposed, but the present disclosure is not limited to this disposition. Only one of amplification elements 21 and 22 thus may be disposed on the principal surface that is opposite to the principal surface on which matching circuits 71 and 72 are disposed. In this case, one of the amplification elements that is more capable of reducing mismatching losses caused by wiring losses and wiring variations may be disposed on the principal surface opposite to the principal surface on which the matching circuits are disposed.

Also, the communication device in the foregoing embodiments is a reception device, but the present discloser is not limited to this. The communication device thus may be, for example, a transmission-reception device. In this case, the radio frequency module may include a transmission circuit that includes a power amplifier, a transmission filter, and so forth.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure is widely applicable for use in a communication device (e.g., mobile phone) as a radio frequency module that is placed at the front-end portion.

The invention claimed is:

1. A radio frequency module, comprising:
a first low-noise amplifier including a first amplification element as an input stage and a second amplification element as an output stage;
a second low-noise amplifier including a third amplification element as an input stage and the second amplification element as an output stage, the third amplification element being different from the first amplification element;
a first matching circuit connected to an input terminal of the first low-noise amplifier; and
a module substrate including a first principal surface and a second principal surface opposite to each other, wherein
the first amplification element is disposed on one of the first principal surface and the second principal surface, and
the first matching circuit is disposed on another of the first principal surface and the second principal surface.

2. The radio frequency module of claim 1, wherein
in a plan view of the module substrate, a footprint of the first amplification element overlaps a footprint the first matching circuit.

3. The radio frequency module of claim 2, wherein
the first amplification element is connected to the first matching circuit by way of a via-conductor located inside of the module substrate.

4. The radio frequency module of claim 1, further comprising:
a second matching circuit connected to an input terminal of the second low-noise amplifier.

5. The radio frequency module of claim 4, wherein
the third amplification element is disposed on one of the first principal surface and the second principal surface, and
the second matching circuit is disposed on another of the first principal surface and the second principal surface.

6. The radio frequency module of claim 5, wherein
in a plan view of the module substrate, a footprint of the third amplification element overlaps a footprint of the second matching circuit.

7. The radio frequency module of claim 6, wherein
the second matching circuit is connected to the third amplification element by way of a via-conductor located inside of the module substrate.

8. The radio frequency module of claim 5, further comprising:
a first filter connected to the input terminal of the first low-noise amplifier via the first matching circuit; and
a second filter connected to the input terminal of the second low-noise amplifier via the second matching circuit.

9. The radio frequency module of claim 8, wherein
the first matching circuit is directly connected to the first filter and the first low-noise amplifier, and
the second matching circuit is directly connected to the second filter and the second low-noise amplifier.

10. The radio frequency module of claim 9, wherein
an operation of the third amplification element is stopped to receive a radio frequency signal in a first communication band, and
an operation of the first amplification element is stopped to receive a radio frequency signal in a second communication band that is different from the first communication band.

11. The radio frequency module of claim 4, further comprising:
a plurality of external-connection terminals.

12. The radio frequency module of claim 11, further comprising:
a first filter connected to an input terminal of the first low-noise amplifier via the first matching circuit; and
a second filter connected to an input terminal of the second low-noise amplifier via the second matching circuit, wherein
the first matching circuit, the second matching circuit, the first filter, and the second filter are disposed on the first principal surface.

13. The radio frequency module of claim 12, wherein
the first low-noise amplifier, the second low-noise amplifier, and the plurality of external-connection terminals are disposed on the second principal surface.

14. The radio frequency module of claim 1, wherein
the first low-noise amplifier and the second low-noise amplifier are included in a same semiconductor component.

15. The radio frequency module of claim 1, wherein
the first low-noise amplifier, the second low-noise amplifier, and the first matching circuit are included in a first reception circuit.

16. The radio frequency module of claim 15, further comprising:
a second reception circuit; and
a switch configured to switch between connecting the first reception circuit and a radio frequency output terminal, and connecting the second reception circuit and the radio frequency output terminal.

17. The radio frequency module according to claim 16, wherein
the first low-noise amplifier, the second low-noise amplifier, and the switch are included in a same semiconductor component.

18. A communication device, comprising:
a signal processing circuit configured to process a radio frequency signal; and
the radio frequency module configured to transfer the radio frequency signal between the signal processing circuit and an antenna, wherein
the radio frequency module includes
a first low-noise amplifier including a first amplification element as an input stage and a second amplification element as an output stage;
a second low-noise amplifier including a third amplification element as an input stage and the second amplification element as an output stage, the third amplification element being different from the first amplification element;

a first matching circuit connected to an input terminal of the first low-noise amplifier; and a module substrate including a first principal surface and a second principal surface opposite to each other, wherein the first amplification element is disposed on one of the first principal surface and the second principal surface, and the first matching circuit is disposed on an another of the first principal surface and the second principal surface.

19. A radio frequency module, comprising:

a module substrate including a first principal surface and a second principal surface opposite to each other;

a first low-noise amplifier disposed on the first principal surface and including a first amplification element and a second amplification element;

a second low-noise amplifier including a third amplification element and the second amplification element, the third amplification element being different from the first amplification element; and a first matching circuit disposed on the second principal surface and connected to an input terminal of the first low-noise amplifier.

20. The radio frequency module of claim 19, wherein in a plan view of the module substrate, a footprint of the first amplification element overlaps a footprint of the first matching circuit, and the first amplification element is connected to the first matching circuit by a via-conductor located inside the module substrate.

* * * * *